United States Patent
Hoffmann et al.

(10) Patent No.: US 11,630,395 B2
(45) Date of Patent: Apr. 18, 2023

(54) CONTROL SYSTEM, OPTICAL SYSTEM AND METHOD

(71) Applicant: Carl Zeiss SMT GmbH, Oberkochen (DE)

(72) Inventors: Malte Hoffmann, Aalen/Ebnat (DE); Gunther Schulz, Lauingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 76 days.

(21) Appl. No.: 17/395,837

(22) Filed: Aug. 6, 2021

(65) Prior Publication Data

US 2021/0364926 A1    Nov. 25, 2021

Related U.S. Application Data

(63) Continuation of application No. PCT/EP2020/053324, filed on Feb. 10, 2020.

(30) Foreign Application Priority Data

Feb. 12, 2019   (DE) .......................... 102019201810.6

(51) Int. Cl.
   *G03F 7/20*    (2006.01)
   *G05B 23/02*   (2006.01)

(52) U.S. Cl.
   CPC ......... *G03F 7/705* (2013.01); *G05B 23/0208* (2013.01); *G05B 2223/06* (2018.08)

(58) Field of Classification Search
   CPC . G03F 7/70483; G03F 7/705; G05B 2223/06; G05B 23/0208; G05B 23/0218
   See application file for complete search history.

(56) References Cited

U.S. PATENT DOCUMENTS

| | | | |
|---|---|---|---|
| 2003/0179377 A1* | 9/2003 | Masaki | G03F 7/70891 356/400 |
| 2009/0055025 A1* | 2/2009 | Zeltzer | F16H 61/00 700/261 |

(Continued)

FOREIGN PATENT DOCUMENTS

| | | |
|---|---|---|
| DE | 10 2015 205 370 A1 | 9/2016 |
| DE | 10 2016 213 025 A1 | 9/2016 |

(Continued)

OTHER PUBLICATIONS

S. Srinivasan et al., "Linear Position Sensors for Prognostics", ip.com Journal, ip.com Inc., West Henrietta, NY, US, Jan. 30, 2015 (Jan. 30, 2015), XP013166345, ISSN: 1533-0001.

(Continued)

*Primary Examiner* — Deoram Persaud
(74) *Attorney, Agent, or Firm* — Fish & Richardson P.C.

(57) ABSTRACT

A control system, for example for an optical system, includes: an actuating element; a measuring element for acquiring actuating element measurement data of the actuating element; a regulating unit for generating a regulating signal for regulating the actuating element depending on the acquired actuating element meas-urement data; and a state monitoring unit for monitoring a state of the control system depending on the acquired actuating element measurement data. The state monitoring unit includes: a first processing unit for generating preprocessed state data depending on (i) the acquired actuating element measurement data and a physical model and/or a mathematical model of the actuating element, or (ii) the acquired actuating element measurement data, a physical model and/or a mathematical model of the actuating element and the generated regulating signal; and a second processing unit for determining the state of the control system depending on the preprocessed state data.

20 Claims, 6 Drawing Sheets

(56) References Cited

U.S. PATENT DOCUMENTS

| | | | | |
|---|---|---|---|---|
| 2011/0235012 A1* | 9/2011 | Fischer | ................... | G03F 7/709 |
| | | | | 355/67 |
| 2016/0280035 A1* | 9/2016 | Göhrle | ................. | B60G 17/019 |
| 2019/0171182 A1* | 6/2019 | Foiret | ................ | G05B 19/4062 |
| 2021/0174254 A1* | 6/2021 | Fujii | .................... | G06K 9/6298 |
| 2021/0400362 A1* | 12/2021 | Ema | ......................... | H04Q 9/00 |

FOREIGN PATENT DOCUMENTS

| | | |
|---|---|---|
| DE | 10 2015 008 754 A1 | 1/2017 |
| EP | 2 511 765 A2 | 10/2012 |

OTHER PUBLICATIONS

Translation of International Search Report for corresponding Appl No. PCT/EP2020/053324, dated May 26, 2020.

* cited by examiner

CONTROL SYSTEM, OPTICAL SYSTEM AND METHOD

CROSS-REFERENCE TO RELATED APPLICATIONS

The present application is a continuation of, and claims benefit under 35 USC 120 to, international application PCT/EP2020/053324, filed Feb. 10, 2020, which claims benefit under 35 USC 119 of German Application No. 10 2019 201 810.6, filed Feb. 12, 2019. The entire disclosure of these applications are incorporated by reference herein.

FIELD

The present disclosure relates to a control system, for example for an optical system or a lithography apparatus, to an optical system including such a control system and to a method for operating a control system.

BACKGROUND

Known control systems include a plurality of actuatable elements, wherein accurate and/or time-critical driving of the actuatable elements is often of importance for operation of such systems. One example of such a control system is a microlithographic apparatus.

Microlithography is used for producing microstructured components, such as, for example, integrated circuits. The microlithography process is performed using a lithography apparatus, which has an illumination system and a projection system. The image of a mask (reticle) illuminated via the illumination system is in this case projected via the projection system onto a substrate, for example a silicon wafer, which is coated with a light-sensitive layer (photoresist) and arranged in the image plane of the projection system, in order to transfer the mask structure to the light-sensitive coating of the substrate. The projection system includes for example a plurality of actuatable optical components, such as lens elements or mirrors.

Failure of an optical component can result in unexpected delays in production and thus in high losses, for which reason it is desirable to monitor the state of the system as accurately as possible. Monitoring systems are known which monitor the state of the system with the aid of specific sensors. One difficulty in the case of highly complex control systems such as lithography apparatuses may be posed by the operating conditions if such a system is operated in a vacuum, for example, since cooling of electronic components that are part of the monitoring system can be complicated. Therefore, a computing power within the system itself is often limited, for which reason not all available data can be processed for monitoring.

SUMMARY

The present disclosure seeks to provide an improved control system.

In accordance with a first aspect, a control system, for example for an optical system, includes an actuating element, a measuring element for acquiring actuating element measurement data of the actuating element, and a regulating unit for generating a regulating signal for regulating the actuating element depending on the acquired actuating element measurement data. Furthermore, provision is made of a state monitoring unit for monitoring a state of the control system depending on the acquired actuating element measurement data.

The actuating element measurement data that are conventionally acquired and used for regulating purposes can also be used for the state monitoring of the control system. The state of the control system can thus be monitored for example solely on the basis of the acquired actuating element measurement data, such that specific sensors, such as surroundings sensors, for monitoring the state can be obviated. Alternatively, the actuating element measurement data can be used in addition to measurement data from existing surroundings sensors for the state monitoring. A larger database is thus created that can be used to monitor the state of the control system more accurately. For example, the actuating element measurement data can be used for predicting a future state, for example maintenance work becoming desirable in the future, so-called predictive maintenance. This can be a desirable application since the actuating element measurement data are for example unprocessed raw data of the respective actuating elements from which a state of the respective actuating element can be derived without being corrupted.

The control system can be, for example, a highly complex system including a plurality of actuating elements to be controlled, for example an automation apparatus, a robotics fac-tory, a large-scale industrial apparatus, research equipment or part of research equipment, an autonomous system, a communication system and/or a lithography apparatus.

In the case of a lithography apparatus including for example an optical system having a plurality of controllable optical elements, for example microlens element arrays and/or micromirror arrays, it can be important during ongoing operation that each of the optical elements is exactly controllable. Any erroneous position, however minor, of an optical element can result in a loss of resolution and/or exposure errors, which can have adverse effects for example on a function of a microchip fabricated by the lithography apparatus.

In the case of EUV lithography apparatuses, for example, firstly it is generally no longer possible to employ transmissive optical elements, and secondly it generally is desirable for the projection lens to be evacuated, such that a beam path proceeds in a vacuum. Under these conditions it can be particularly difficult to operate active components, such as microelectronic components, for example, since during operation these components usually generate waste heat to a certain extent and, on account of the vacuum, which waste heat typically cannot be dissipated via the surrounding medium, for example air, and the convection thereof. Furthermore, structural space may be limited, for which reason complicated cooling concepts, for example liquid cooling arrangements, may not be readily usable. Under such conditions it can be desirable to generate as little waste heat as possible, for which reason for example a computational capacity available in this innermost core of the control system is limited.

This innermost core of the control system may also be referred to hereinafter as bottommost level or as embedded system. In the case of a lithography apparatus, the embedded system can be delimited toward the outside by a vacuum housing, for example. Furthermore, the embedded system can be understood to mean that part of the control system within which signal processing and/or signal transfer are/is proprietary. That is to say that, for example, only the manufacturer of the embedded system can understand the data and/or the signals which are generated and/or transferred within the embedded system. An interface that communicates in accordance with a specific, disclosed communication protocol may be regarded as a boundary of the embedded system, for example.

Actuating elements include for example actuatable elements or actuators, such as, for example, a micromirror of a micromirror array with an associated joint. The actuating element can be set or adjusted for example in at least one dimension, for example displaced in a direction, tilted about an axis and/or rotated about an axis. In this respect each available setting dimension forms a degree of freedom of the actuating element. A position of the actuating element is unambiguously defined for example if a value on a setting scale is known for each degree of freedom.

The actuating elements are settable via the regulating unit, for example. The regulating unit can also be referred to as motor control. The regulating unit generates a regulating signal for example for each actuating element of the control system. If the actuating element has a plurality of degrees of freedom, an independent regulating signal can be provided for each degree of freedom. Depending on the regulating signal, the actuating element alters its setting, for example its position. By way of example, the actuating element has a position dependent on a current intensity, wherein the current intensity is provided for example by a current source depending on a duty factor. The regulating unit can then generate for example the duty factor as the regulating signal. A control system can include for example a plurality of regulating units. Optionally, a respective regulating unit is arranged for the actuating element or actuating elements to be regulated.

At least one actuating element of the control system can include an assigned measuring element configured for acquiring actuating element measurement data of the actuating element. A measuring element can for example also be referred to as sensor, measuring transducer or transmitter. The measuring element can acquire the actuating element measurement data for example depending on a position of the actuating element in relation to a specific degree of freedom. Such a measuring element can also be referred to as position sensor, wherein the position sensor has a spatial resolution in the nm range, for example. The actuating element measurement data represent for example an actual setting or position of the actuating element. Therefore, the actuating element measurement data are provided to the regulating unit as input values for the regulation.

The actuating element measurement data can be generated by the measuring element as an analog signal or else as a digital signal. The measuring element generates the actuating element measurement data with a clock frequency of 10 kHz, for example. If the actuating element measurement data are generated as an analog signal, the latter can be converted into a digital signal for example by an analog-to-digital converter, a sampling rate being 100 kHz, for example.

Provision can also be made for a single measuring element to be assigned to a plurality of actuating elements. The measuring element can then be configured to generate actuating element measurement data for each assigned actuating element and to output the actuating element measurement data as a separate signal.

The state monitoring unit can be configured for monitoring the state of the control system depending on the actuating element measurement data. The state monitoring unit can be implemented in terms of hardware technology and/or in terms of software technology. In the case of an implementation in terms of hardware technology, the state monitoring unit can be embodied as a computer or as a microprocessor, for example. In the case of an implementation in terms of software technology, the state monitoring unit can be embodied as a computer program product, as a function, as a routine, as part of a program code or as an executable object. The state monitoring unit can be wholly or partly a constituent of the embedded system, that is to say of the bottommost level of the control system.

A state of the control system can be understood to mean a global state, such as an overall state of the control system, but also a state of a single actuating element or of a plurality of actuating elements. The state can be represented for example as a parameter, a set of parameters, as a scalar, as a vector, as a tensor, as a scalar field, as a vector field and/or as a tensor field. The state can furthermore include a current state and/or a future state. A respective state can also include or take account of past states.

The state includes for example variables derived from the actuating element measurement data. One example thereof is a total path distance covered by an actuator since the actuator was put into operation. Furthermore, for example, environmental influences, such as excited vibrations or a temperature, for example, can also be deduced from the actuating element measurement data.

The monitoring of the state is understood to mean, for example, that the state monitoring unit determines a respective state of the control system. Determining is understood to mean, for example, that the state monitoring unit processes the actuating element measurement data, for example stores them, analyzes them and/or carries out calculations depending on the actuating element measurement data. For example, the actuating element measurement data can be used as an input variable for physical and/or mathematical models, wherein for example an estimated value and/or a physical measurement variable are/is obtained as output variable. For example, the state monitoring unit is configured to output the output variables obtained in this way to a further unit and/or to store them.

Furthermore, monitoring can be understood to mean that the state monitoring unit compares the determined state with an expected state and/or with a predetermined state, for example a limit value. Depending on the comparison, provision can be made, for example, for the state monitoring unit to generate and output an alarm or an indication.

Optionally, the state monitoring unit is configured for monitoring the state depending on the regulating signal generated by the regulating unit. For example, the regulating signal for the actuating element and the actuating element measurement data acquired by the assigned measuring element can be coupled to one another or correlated with one another by the state monitoring unit. From data correlated in this way it is possible to identify particularly easily whether the actuating element is operating according to an original specification or characteristic curve. Thus, wear phenomena can already be identified at an early stage and maintenance measures involved in the future can therefore be better predicted and/or planned.

The state of the proposed control system can be monitored for example without additional sensors and only depending on the actuating element measurement data, for which reason a complexity of the control system can be reduced and the control system can therefore be constructed more simply, whereby costs can be saved. Furthermore, the proposed control system can be such that the state monitoring is effected on the basis of the original actuating element measurement data even before data reduction was effected.

In accordance with one embodiment of the control system, the state monitoring unit includes a first processing unit for generating preprocessed state data depending on the acquired actuating element measurement data or depending on the acquired actuating element measurement data and the generated regulating signal, and a second processing unit for determining the state of the control system depending on the preprocessed state data.

For example, the first processing unit is part of the embedded system and thus arranged at the bottommost level of the control system. The first processing unit is thus subject to the possibly stringent desired properties with regard to space, energy consumption, waste heat and/or further emissions. The second processing unit is optionally arranged at a higher level of the control system to which the same stringent desired properties do not apply. What can be achieved by this division of the state monitoring unit is that on the one hand all raw data are available or can be used for the state monitoring, but on the other hand computationally intensive evaluations can be carried out temporally downstream outside the embedded system.

The largest amount of raw data can be generated during ongoing operation of the control system at the bottommost level, in the embedded system, since for example the actuating elements, the measuring elements and the regulating unit are arranged there. For example, the amount of raw data generated per unit time, that is to say the raw data rate, can be so high that, on account of the technical boundary conditions, this cannot be completely transferred out of the embedded system into external systems. The technical boundary conditions are in some instances stringent desired properties that apply to the embedded system. This also includes for example the fact that a data transfer toward the outside is not arbitrarily scalable since the transmitters/receivers and lines used for this also desirably satisfies correspondingly stringent desired properties. An available bandwidth for the data transfer may therefore be limited.

The first processing unit can therefore be configured for example for preprocessing the raw data in order to reduce an amount of data that is transferred out of the embedded system to the second processing unit. Preprocessing is understood to mean, for example, that the first processing unit receives the actuating element measurement data and/or the regulating signal and carries out for example simple mathematical operations, such as an averaging, a gradient, a summation, a comparison and/or a multiplication. As the result of the preprocessing by the first processing unit, the latter can generate preprocessed state data. The preprocessed state data can be transferred for example to the second processing unit. The preprocessed state data have for example a data rate that is significantly lower than the raw data rate, for example only 10% thereof, optionally only 1% thereof.

The second processing unit optionally can have a significantly higher computing power, for example a time-non-critical computing power, compared with the first processing unit and is configured to determine the state of the control system depending on the preprocessed state data. For this purpose, the second processing unit can be configured to store the preprocessed state data, to analyze them and/or to carry out calculations with them. For example, the preprocessed state data can be used as an input variable for physical and/or mathematical models, wherein for example an estimated value and/or a physical measurement variable are/is obtained as output variable. For example, the second processing unit is configured to output the output variables obtained in this way to a further unit and/or to store them.

In embodiments, the second processing unit can be configured to drive the first processing unit, such that the latter for example generates the preprocessed state data in a different way, for example using a different calculation method.

In accordance with an embodiment of the control system, the first processing unit is configured to acquire and to process the acquired actuating element measurement data continuously, for example synchronously with the acquisition of the actuating element measurement data by the measuring element.

This embodiment can ensure that all actuating element measurement data are used for the state monitoring. If the data are present as digital data, this is understood to mean, for example, that each bit, for example the value of each bit generated by the measuring element or an analog-to-digital converter, is taken into account when generating the preprocessed state data. Acquisition of the acquired actuating element measurement data by the first processing unit should be understood to mean acceptance of the acquired actuating element measurement data. Continuously should be understood for example to the effect that the acquired actuating element measurement data are acquired by the first processing unit without a temporal interruption as long as the measuring element acquires the actuating element measurement data. In this case, provision can be made for the acquired actuating element measurement data to be partly buffered before the preprocessed state data are generated.

In accordance with an embodiment of the control system, the first processing unit is configured to generate the preprocessed state data depending on the acquired actuating element measurement data during ongoing operation of the control system.

In this embodiment, it is possible that there is no need for a special operating mode, for example a test operating mode, in order to determine and/or to monitor the state of the control system. Ongoing operation is understood to mean, for example, that the control system is operated in accordance with standard operation for which the control system is provided. This can be productive operation, for example.

In the case of a lithography apparatus, ongoing operation is production operation, for example, wherein the actuating element measurement data and/or the regulating signal are/is acquired and processed for example even during an exposure. In this respect, the preprocessed state data are generated permanently during operation.

Optionally, the second processing unit is also configured to determine the state of the control system depending on the preprocessed state data during ongoing operation.

In accordance with an embodiment, the control system includes a driving unit for generating actuating element driving data depending on a currently implemented operating program from a number of operating programs. The regulating unit is configured for generating the regulating signal depending on the actuating element driving data, wherein the first processing unit is configured for generating the preprocessed state data depending on the currently implemented operating program.

The driving unit can also be referred to as position control. The driving unit can be embodied as an independent unit or else as part of the regulating unit. The actuating element driving data include for example individual target position data for each actuating element. The regulating unit can receive the target position data and translate them into a corresponding regulating signal for a respective actuating element.

The number of operating programs includes for example a standard operating mode, a test operating mode and/or else an emergency operating mode.

A test operating mode can be provided for example for the testing of the control system. The test operating mode can be particularly helpful for determining the state of the control system and/or of individual actuating elements. The test operating mode can be initiated for example manually and/or automatically, for example at regular time intervals. The test operating mode can be carried out for example during pauses in production. The test operating mode can also be restricted to specific regions of the control system. By way of example, a control system includes two regions that are active alternately since, for example, one carries out preprocessing and the other carries out postprocessing, such that one region respectively waits for the other. Then, during this idle phase of one of the regions, a test can be carried out with this region.

The first processing unit generates the preprocessed state data depending on the respective operating program. By way of example, provision can be made for the preprocessed state data to be generated in accordance with a first preprocessing method during ongoing operation and to be generated in accordance with a second preprocessing method during a test operating mode. For example, provision can be made for the preprocessed state data to be identical to the raw data in a specific operating program. By way of example, the first processing unit includes a buffer storage device, in which the raw data are buffer-stored until they are transferred toward the outside.

In accordance with an embodiment of the control system, the latter includes a surroundings sensor for acquiring surroundings sensor data, wherein the first processing unit is configured for generating the preprocessed state data depending on the acquired surroundings sensor data.

This embodiment can be particularly desirable to combine as much information as possible regarding the control system for the purpose of monitoring the state.

Surroundings sensors can be sensors of any type, for example temperature, pressure, gas, acceleration, radiation, current, voltage and/or flow sensors. A surroundings sensor is, for example, a sensor whose acquired data are not used for the regulation of the actuating elements regulated by the regulating unit. The surroundings sensor data acquired by the surroundings sensor can relate to one actuating element, one measuring element, a number of a plurality of actuating or measuring elements and/or to passive elements of the control system.

Taking account of the acquired surroundings sensor data already when generating the preprocessed state data can be particularly desiable so that a data rate of the preprocessed state data is kept low. By way of example, the method employed for preprocessing can be selected depending on the acquired surroundings sensor data.

The acquired surroundings sensor data can themselves be part of the preprocessed state data, for example even without being preprocessed. In this respect, the acquired surroundings sensor data can be provided to the second processing unit as raw data.

In accordance with an embodiment of the control system, the measuring element is configured to acquire the actuating element measurement data with a frequency of 1 kHz to 10 kHz (e.g., 1 kHz to 100 kHz, 1 kHz to 1 MHz).

The acquisition frequency of the measuring element depends for example on the purpose of use of the assigned actuating element. In high-speed applications, a high frequency can be desirable, wherein a high acquisition frequency results in a high raw data rate, for example.

In accordance with an embodiment of the control system, the regulating unit is configured to generate the regulating signal with a frequency of 1 kHz to 10 kHz (e.g., 1 kHz to 100 kHz, 1 kHz to 1 MHz).

The clock frequency of the regulating signal depends for example on the purpose of use of the actuating element regulated thereby. In high-speed applications, a high frequency is desirable.

Optionally, an acquisition frequency of the measuring element is an order of magnitude greater than the clock frequency of the regulating signal.

In accordance with an embodiment of the control system, the first processing unit is configured to generate the preprocessed state data with a data rate that is at most 10%, optionally at most 1%, of a data rate of the acquired actuating element measurement data, wherein each individual acquired actuating element measurement datum influences the preprocessed state data.

This embodiment can make it possible that even in the case of a high actuating element measurement data rate and limited transfer bandwidth out of the embedded system, all acquired actuating element measurement data are taken into account in the state monitoring. The first processing unit can thus be configured for reducing the data rate, without discarding data. Optionally, the first processing unit determines and/or calculates specific derived data from the acquired actuating element measurement data and outputs them as the preprocessed state data.

In accordance with an embodiment of the control system, the first processing unit is configured for generating the preprocessed state data depending on the acquired actuating element measurement data and a physical model of the respective actuating element of the plurality.

A physical model includes for example a mathematical description of physical relationships and/or physical parameters. One simple model is for example the description of a spring pendulum described by a mass, a spring constant and a damping term. For different actuating elements, different physical models can be applied, depending on the type of respective actuating element.

Such physical models can allow one or more characteristic values for a respective system to be determined or derived from a large amount of data, which values can have for example a physical dimension or significance. Furthermore, the physical model can include statistical methods, such that proceeding from value distributions, for example, moments of these distributions can be determined, for example a standard deviation, a variance and suchlike.

In accordance with an embodiment of the control system, the actuating element includes an actuator for setting a position of an element, for example a Lorentz actuator, and the measuring element includes a position sensor for acquiring the position of the element, for example an interferometer and/or a CCD camera.

Optionally, a position of the element, which is for example an optical element, such as a mirror or a lens element, can be set with an accuracy of at least 1 μm in a lateral direction and with an accuracy of at least 10 μrad in a direction of rotation. The position sensor is optionally configured for acquiring the position with at least the same accuracy, optionally with a 10-fold higher accuracy.

In general, the higher a setting accuracy of the actuating elements, the higher the resolution of the measuring elements should be, too, and optionally be at least equal in magnitude. In the present case, a position is understood to mean for example a tilting, a rotation or else a displacement.

By way of example, a current temperature of the respective actuating element can be deduced from the actuating element measurement data, provided that the latter have a sufficiently high spatial and/or temporal resolution.

In accordance with an embodiment of the control system, the regulating unit and the state monitoring unit, for example the first processing unit, are integrated on an SoC (System-on-Chip) and/or on an FPGA (Field programmable gate array), optionally the SoC or the FPGA being arranged at a bottommost level of the control system.

The bottommost level of the control system corresponds to the embedded system. SoCs or FPGAs can have a high integration density, have a comparatively low energy use and thus little waste heat, and a high computing power by virtue of specific programming.

In accordance with an embodiment of the control system, the second processing unit is arranged at a higher level than the bottommost level of the control system, wherein the first processing unit is configured for transferring the preprocessed state data to the second processing unit via a data connection.

In this embodiment, the second processing unit complies with significantly less stringent properties regarding space and/or an energy consumption in comparison with the first processing unit. By way of example, the higher level is arranged outside a vacuum. Electronic components can then be cooled with air, which is particularly simple.

The data connection is optionally a data line shielded against interference caused by electromagnetic fields. This can include for example an electrical connection, such as a twisted pair cable or a coaxial cable. The data connection is optionally configured for serial data transfer, but parallel transfer protocols can also be used.

Moreover, the second processing unit can have large assigned data storage devices. Such a large data storage device includes for example at least 100 GB of storage space, optionally at least 1 TB. Optionally, the storage space is large enough that the preprocessed state data of a complete production phase can be stored therein. These data can then be analyzed for example also temporally downstream.

In accordance with an embodiment of the control system, the second processing unit is configured to analyze the preprocessed state data via a machine learning algorithm and/or statistical evaluation methods.

This can be desirable if complex relationships in a multiplicity of data are intended to be recognized. By way of example, correlations between different actuating elements, actuating element measurement data, and/or surroundings sensor data can be recognized in this way, which can be taken into account for further operation. For example, weak points of the control system can also be recognized and rectified if desired. A spectral analysis of temporal position data can provide indications about resonance frequencies and/or ex-citations, for example, which can thereupon be adapted or avoided in order to improve an accuracy.

In accordance with an embodiment of the control system, the state monitoring unit is configured to determine a future state of the control system, for example a fault state or a maintenance-necessitating state of an optical system, depending on the monitored state or the preprocessed state data.

By way of example, the state monitoring unit is configured to carry out a so-called predictive maintenance analysis on the basis of the preprocessed state data. In this case, a prediction about future failures can be effected on the basis of the acquired data, for example the actuating element measurement data. Desired maintenance can thus be better planned, for example integrated into ongoing operation. Furthermore, spare parts that may be desired can be procured in a targeted manner and on schedule. A financial risk on account of a sudden operational failure can be significantly reduced with this method. On account of the multiplicity of data available for the state monitoring in the case of the proposed control system, the state of the control system overall, the state of individual actuating elements individually and/or components including a number of actuating elements can be determined significantly more accurately than would be the case if exclusively surroundings sensors were used. In addition, the actuating element measurement data can be always up to date and thus describe an up to date actual state, wherein for example a wear curve is derivable from a temporal profile of the actual states, which curve can provide information about a wear state and thus for example about a remaining duration left until a failure.

In embodiments, the state monitoring unit is furthermore configured to carry out a predetermined action depending on the future state determined.

Optionally, the state monitoring unit outputs a corresponding indication or a warning if a specific limit value in relation to a future state determined is exceeded or undershot.

The state monitoring unit can also be configured to output the state determined, for example the future state determined, and/or a variable derived therefrom, for example to the regulating unit and/or a position regulation. This can then be configured to adapt a regulation characteristic depending on the data received from the state monitoring unit. This can be referred to for example as a state-adaptive regulation. For example, in the case of actuatable elements the regulation can be effected in such a way that specific positions of a servomotor are avoided in the future if possible.

In accordance with an aspect, the disclosure provides an optical system, for example a lithography apparatus, including a control system described herein.

In this case, the control system includes for example at least one actuating element for driving a controllable optical element. Micromirror arrays or microlens element arrays are examples of a controllable optical element.

In accordance with an aspect, the disclosure provides a method for operating a control system described herein or an optical system described herein. In a first method step, actuating element measurement data are acquired. In a second method step, a regulating signal is generated depending on the acquired actuating element measurement data. In a third method step, the state of the control system or of the optical system is monitored depending on the acquired actuating element measurement data.

This method can be able to be carried out with the control system in accordance with the first aspect or one of the embodiments and with the optical system in accordance with the second aspect.

The method can include further, optional method steps. For example, it can be provided that preprocessed state data are generated depending on the acquired actuating element measurement data via a first processing unit, and the preprocessed state data are then communicated to a second processing unit via a communication connection, wherein the second processing unit determines a state of the control system depending on the preprocessed state data.

In accordance with one embodiment of the method, the latter furthermore includes maintaining the optical system depending on the monitored state.

"A(n); one" in the present case should not necessarily be understood as restrictive to exactly one element. Rather, a plurality of elements, such as, for example, two, three or more, can also be provided. Any other numeral used here, too, should not be understood to the effect that there is a restriction to exactly the stated number of elements. Rather, numerical deviations upwards and downwards are possible, unless indicated to the contrary.

The embodiments and features described for the control system apply, mutatis mutandis, to the proposed method, and vice versa.

Further possible implementations of the disclosure also include not explicitly mentioned combinations of features or embodiments that are described above or below with respect to the exemplary embodiments. In this case, a person skilled in the art will also add individual aspects as improvements or supplementations to the respective basic form of the disclosure.

Further configurations and aspects of the disclosure are the subject matter of the dependent claims and also of the exemplary embodiments of the disclosure described below. In the text that follows, the disclosure is explained in more detail on the basis of embodiments with reference to the accompanying figures.

DETAILED DESCRIPTION

Identical elements or elements having an identical function have been provided with the same reference signs in the figures, unless indicated to the contrary. It should also be noted that the illustrations in the figures are not necessarily true to scale.

Figure 1:
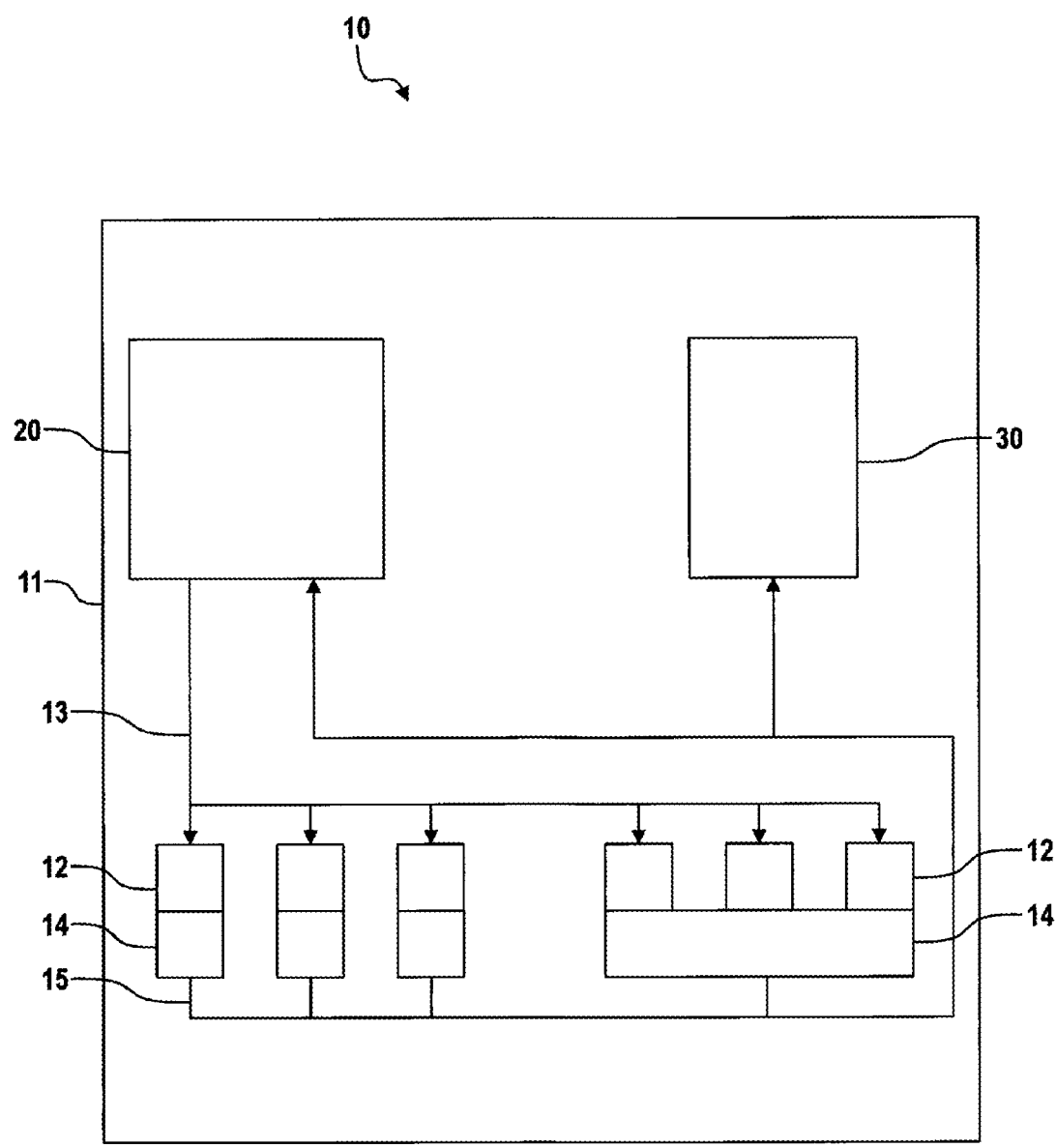
FIG. 1 shows a schematic block diagram of a first embodiment of a control system.

FIG. 1 shows a schematic block diagram of a first exemplary embodiment of a control system 10. The control system 10 is embodied for example as an automation apparatus, for example a lithography apparatus. The automation apparatus 10 includes a plurality of actuating elements 12, for example tools, tool arms, joints, motors and suchlike. Only six actuating elements 12 are shown in FIG. 1 for reasons of clarity, and only two of the actuating elements are provided with reference signs. The actuating elements 12 are regulatable for example by a regulating unit 20 embodied as an integrated circuit, for example an SoC including a multi-core processor, main memory, Flash memory and optionally one or more FPGAs and A/D converters. Regulating is understood to mean, for example, that the regulating unit 20 drives a respective actuating element 12 via a regulating signal 13. The regulating signal 13 can be for example a current signal or else a voltage signal. The regulating signal 13 has the effect, for example, that the actuating element 12 alters a present position in accordance with the regulating signal 13, for example moves to a different position. Although the regulating signal 13 is illustrated as one line in FIG. 1, the regulating signal 13 is individual for each actuating element 12. If one of the actuating elements 12 has a plurality of regulatable axes or degrees or freedom, the regulating signal 13 includes a corresponding regulating signal 13 for each axis or for each degree of freedom. Depending on the actuating element 12, the regulating signal 13 can also be provided as a digital data signal.

In FIG. 1, the actuating elements 12 have assigned measuring elements 14. A respective measuring element 14 is configured for acquiring actuating element measurement data 15. Actuating element measurement data 15 include for example a present position of the assigned actuating element 12. As illustrated on the right-hand side in FIG. 1, a single measuring element 14 can also be configured for acquiring actuating element measurement data 15 of a plurality of actuating elements 12. A measuring element 14 can be configured for example as an optical measuring device or an electrical measuring device. Optionally, for example, it is possible to determine a distance and thus a position very accurately, for example in the nm range. The measuring elements 14 can be configured for outputting the actuating element measurement data 15 as a digital data stream or else as an analog voltage or current signal.

The actuating element measurement data 15 are acquired and output by the respective measuring element 14, for example to the regulating unit 20, which uses the actuating element measurement data for regulating the actuating elements 12. For this purpose, the regulating unit 20 compares for example a predefined target position of a respective actuating element 12 with the actual position of the actuating element 12, the actual position being derivable from the actuating element measurement data 15. If target position and actual position do not match, the regulating unit 20 outputs a corresponding regulating signal 13, whereupon the actuating element 12 regulated thereby adapts its position.

The automation apparatus 10 additionally includes a state monitoring unit 30. The state monitoring unit 30 is embodied for example as an integrated circuit, for example an SoC including a multi-core processor, main memory, Flash memory and optionally one or more FPGAs and A/D converters. In a departure from the illustration in FIG. 1, the state monitoring unit can be integrated jointly with the regulating unit 20 in an integrated circuit. The state monitoring unit 30 is configured to accept the acquired actuating element measurement data 15 and to determine a state of the automation apparatus 10 from the data. A state of the automation apparatus 10 includes a global state, an overall state and also a state of individual actuating elements 12. The state includes for example a present actual position of each actuating element 12. The state optionally also includes derived variables or variables cumulated over a certain operating duration, such as, for example, a number of instances of driving an actuating element 12, a total extent of deflections effected, such as a path distance covered, of an actuating element 12, and/or else a residence distribution in a specific position, the distribution being cumulated in relation to a degree of freedom of movement.

By way of example, the state monitoring unit 30 includes a storage device (not illustrated configured for storing a number of states determined earlier, for example those before the currently determined state. The state monitoring unit 30 can then acquire for example an alteration of the state of the automation apparatus 10. Optionally, the state monitoring unit 30 is configured to determine the state of the automation apparatus 10 depending on the regulating signal 13. For example, for this purpose, the state monitoring unit can link or correlate the regulating signal 13 for a specific actuating element 12 with the acquired actuating element measurement data 15 of the relevant actuating element 12. From data linked in this way it is possible to determine particularly easily whether for example the actuating element 12 reacts to the regulating signal 13 in a manner such as is desired and envisaged. If this is not the case, then this is an indication, for example, that the actuating element 12 exhibits wear phenomena and is desirably exchanged as soon as possible.

Figure 2:
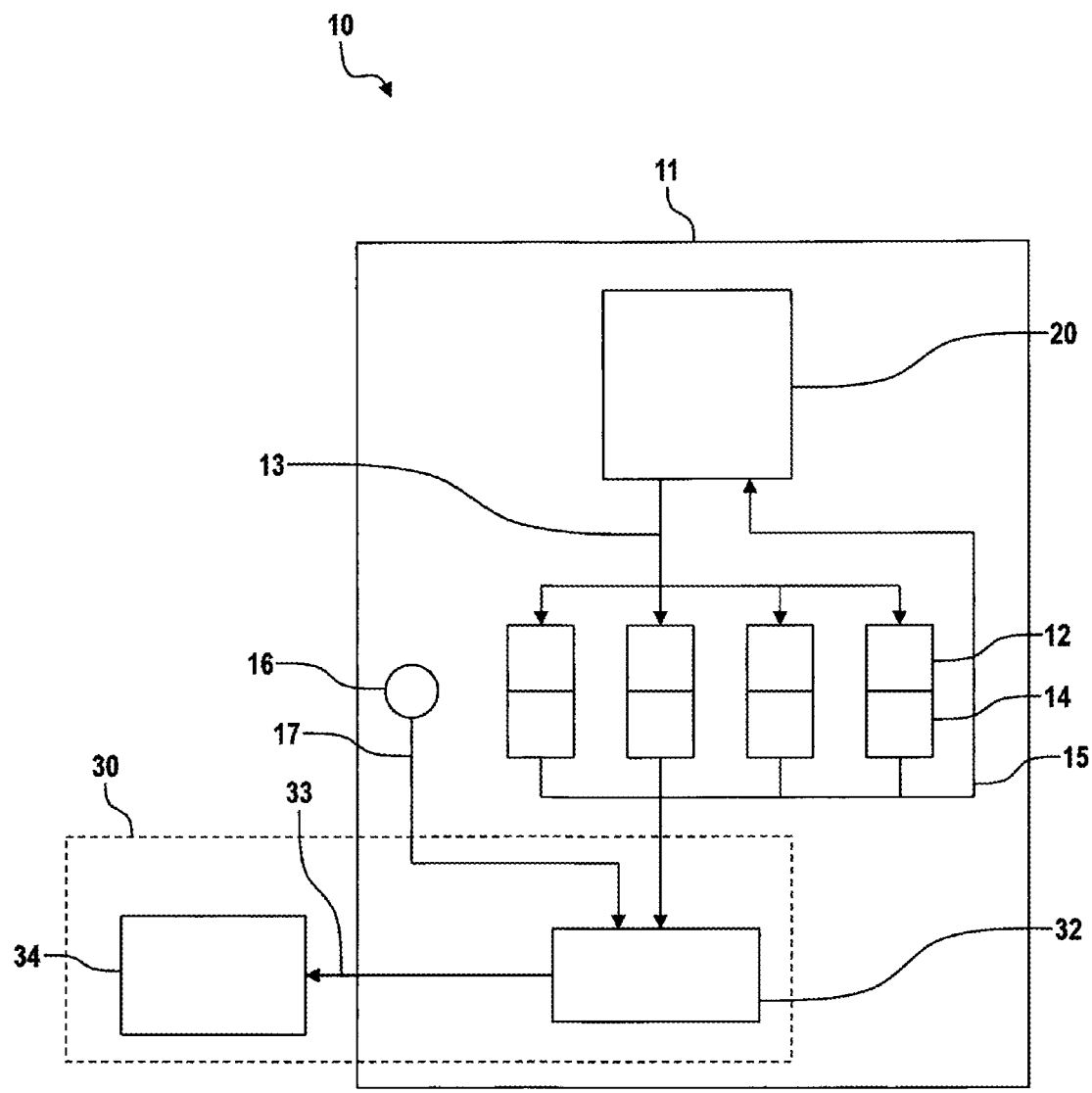
FIG. 2 shows a schematic block diagram of a further embodiment of a control system.

FIG. 2 shows a schematic block diagram of a further embodiment of a control system 10 embodied here for example as an optical system, for example a verification tool or test tool for checking lithographically fabricated structures. In this exemplary embodiment, the optical system 10 includes a core region, designated as embedded system 11. In the present case, the embedded system 11 is distinguished by the fact that all associated components, which will be enumerated below, are arranged in a vacuum housing (not illustrated).

Technical boundary conditions in respect of the design of the components arise on account of this arrangement. Cooling of the embedded system 11 or the components thereof is particularly problematic since gas as cooling medium is not present. Heat generated by electronic components, for example, therefore has to be dissipated either via a solid thermal bridge and/or via a closed liquid cooling system, which is technically complicated since a structural space is very limited in such an optical system 10. Furthermore, liquid cooling arrangements generate vibrations that can be transmitted to the optical system, which can result in undesired losses of resolution. It can therefore be desirable to generate as little heat as possible in the embedded system 11. This can be achieved primarily by reducing a power consumption of electronic components. Therefore, for example, an available computational capacity in the embedded system is upwardly limited. An in-crease in the computational capacity can be achieved primarily by increasing the efficiency, for example the computing power per watt, of the electronic components used. On the other hand, it is desirable to acquire and to process as many operating data of the embedded system 11 as possible, for example for the purpose of state monitoring. On account of the multiplicity of raw data acquired in the embedded system 11, a high data rate arises which, on account of the limitations described, cannot readily be transferred out of the embedded system 11.

The embedded system 11 includes for example a regulating unit 20 and a number of actuating elements 12, only one of which is identified by a reference sign. The regulating unit 20 is configured for generating a regulating signal 13 for regulating the actuating elements 12. The actuating elements 12 furthermore have assigned measuring elements 14 configured for acquiring actuating element measurement data 15. The actuating element measurement data 15 serve for example for regulating the actuating elements 12 via the regulating unit 20. The embedded system 11 furthermore includes a surroundings sensor 16 configured for acquiring and outputting surroundings sensor data 17. The surroundings sensor 16 is configured for example as a temperature and acceleration sensor. The surroundings sensor 16 can include for example a plurality of temperature detectors (not illustrated) for detecting a local temperature at a plurality of positions within the embedded system 11. The acceleration sensor is optionally arranged on a housing (not illustrated), which is also called a Force Frame, for example, and detects the vibrations thereof. Further acceleration sensors can be arranged for example on a suspension of optical elements (not illustrated), for example mirror or lens element arrays, and detect the vibrations thereof In this example, the embedded system 11 furthermore includes a first processing unit 32.

The first processing unit 32 is configured to accept the acquired actuating element measurement data 15 and to process them in accordance with a preprocessing routine. The result of this preprocessing is preprocessed state data 33. The first processing unit 32 furthermore accepts the surroundings sensor data 17 acquired by the surroundings sensor 16 and takes them into account when generating the preprocessed state data 33. The first processing unit 32 transfers the preprocessed state data 33 generated to a second processing unit 34, which is arranged outside the embedded system 11. The first processing unit 32 and the second processing unit 34 together form a state monitoring unit 30.

The first processing unit 32 is configured for example for processing the acquired actuating element measurement data 15 in such a way that a data rate of the preprocessed state data 33 is significantly reduced compared with an actuating element measurement data rate, for example is just 10% thereof, and nevertheless all acquired data are taken into account. This can be effected via averaging (moving average) for example. The surroundings sensor data 17 are likewise taken into account here by the first processing unit 32. For example, the surroundings sensor data 17 can also be part of the preprocessed state data 33 as raw data.

The second processing unit 34 outside the embedded system 11 has a significantly higher computing power compared with the first processing unit 32, for which reason this processing unit can determine a state of the optical system 10 from the preprocessed state data 33 via complicated methods, for example. Optionally, the second processing unit 34 furthermore has an assigned storage device (not illustrated) for storing state data.

On the basis of the states determined, it is possible to make a forecast for example of when individual elements, for example actuating elements 12, of the optical system 10 will fail owing to wear. Repair or maintenance of the optical system 10 can therefore be planned at an early stage and thus better incorporated in productive operation of the optical system 10 for which reason unforeseen production failures can be avoided.

Figure 3:
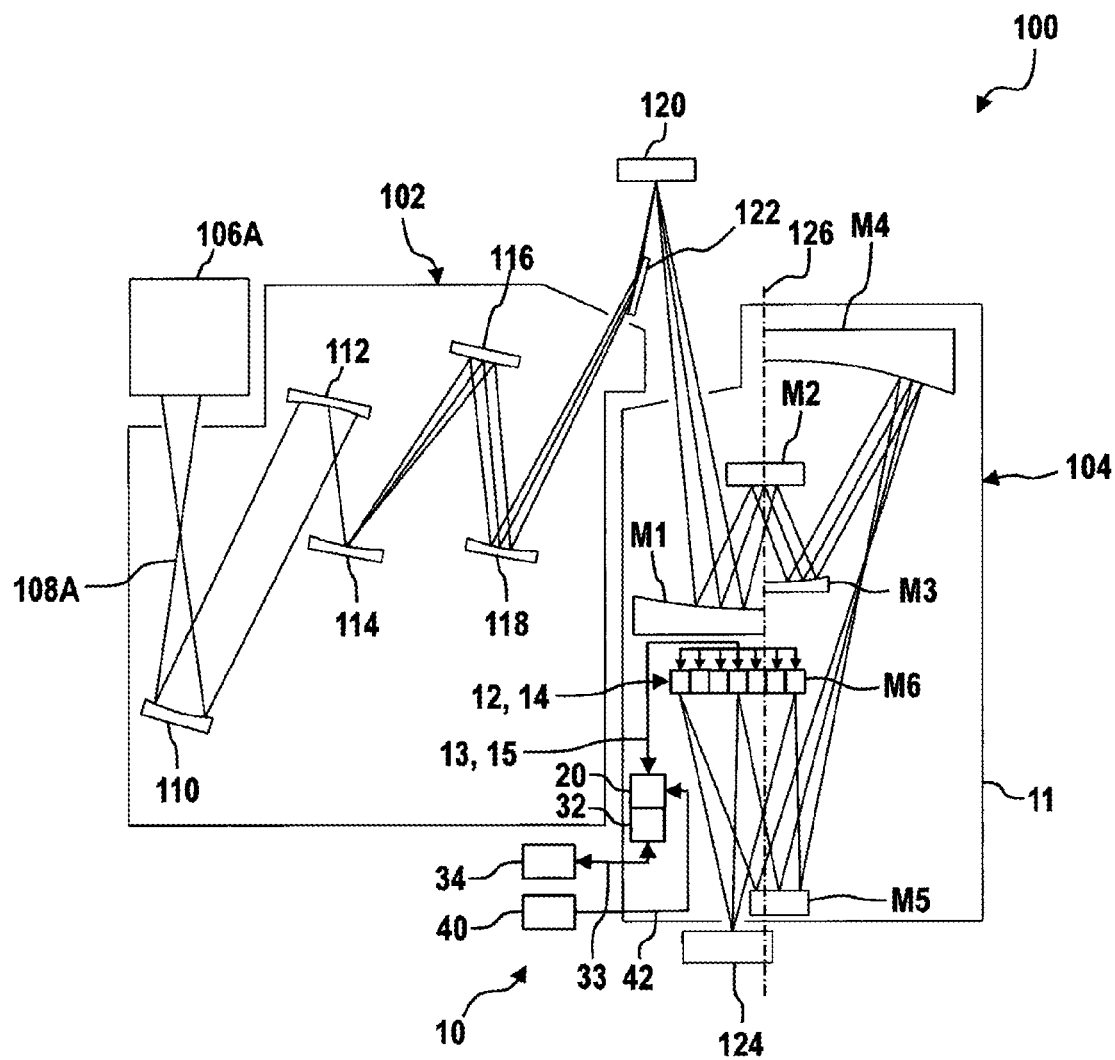
FIG. 3 shows a schematic view of a first embodiment of an optical system embodied as an EUV lithography apparatus.

FIG. 3 shows a schematic view of an optical system 100, embodied here as an EUV lithography apparatus. The EUV lithography apparatus 100 includes a beam shaping and illumination system 102 and a projection system 104. In this case, EUV stands for "extreme ultraviolet" and denotes a wavelength of the working light of between 0.1 nm and 30 nm. The beam shaping and illumination system 102 and the projection system 104 are respectively provided in a vacuum housing (not shown), wherein each vacuum housing is evacuated with the aid of an evacuation device (not shown). The vacuum housings are surrounded by a machine room (not shown), in which drive devices for mechanically moving or setting optical elements are provided. Moreover, electrical controllers and the like can also be provided in this machine room.

The EUV lithography apparatus 100 includes an EUV light source 106A. A plasma source (or a synchrotron), which emits radiation 108A in the EUV range (extreme ultraviolet range), that is to say for example in the wavelength range of 5 nm to 20 nm, can for example be provided as the EUV light source 106A. In the beam shaping and illumination system 102, the EUV radiation 108A is focused and the desired operating wavelength is filtered out from the EUV radiation 108A. The EUV radiation 108A generated by the EUV light source 106A has a relatively low transmissivity through air, for which reason the beam-guiding spaces in the beam shaping and illumination system 102 and in the projection system 104 are evacuated.

The beam shaping and illumination system 102 illustrated in FIG. 3 has five mirrors 110, 112, 114, 116, 118. After passing through the beam shaping and illumination system 102, the EUV radiation 108A is guided onto a photomask (called a reticle) 120. The photomask 120 is likewise embodied as a reflective optical element and can be arranged outside the systems 102, 104. Furthermore, the EUV radiation 108A can be directed onto the photomask 120 via a mirror 122. The photomask 120 has a structure which is imaged onto a wafer 124 or the like in a reduced fashion via the projection system 104.

The projection system 104 is arranged together with a regulating unit 20 and a first processing unit 32 in the vacuum housing and forms with them an embedded system 11. The projection system 104 (also referred to as a projection lens) has five mirrors M1 to M5 and a micromirror array M6 for imaging the photomask 120 onto the wafer 124. In this case, individual mirrors M1 to M5 of the projection system 104 can be arranged symmetrically in relation to an optical axis 126 of the projection system 104. It should be noted that the number of mirrors M1 to M5 of the EUV lithography apparatus 100 is not restricted to the number illustrated. A greater or lesser number of mirrors M1 to M5 can also be provided. Furthermore, the mirrors M1 to M5 are generally curved at their front side for beam shaping. The micromirror array M6 includes 300 individual micromirrors, for example. Each micromirror has two degrees of freedom, which are given by tilting about two axes orthogonal to one another and which are individually settable via an assigned actuator. In this respect, each micromirror constitutes an actuating element 12 having two degrees of freedom. Only seven micromirrors 12 are illustrated in FIG. 3 for reasons of clarity, only one of the micromirrors being identified by a reference sign. Via the micromirror array M6, a profile of the EUV radiation 108A can be adapted, for example for example wavefront variations can be compensated for and an improved resolution of the photomask 120 on the wafer 124 can thus be achieved.

A driving unit 40 arranged outside the projection system 104 is configured for controlling the micromirrors 12 by virtue of the driving unit generating actuating element driving data 42 that are output and transferred to the regulating unit 20. The actuating element driving data 42 include for example a target position for each of the micromirrors 12.

The micromirrors 12 are regulated by the regulating unit 20 via a regulating signal 13. The regulating signal 13 has a clock frequency of 10 kHz, for example. The measuring elements 14 assigned to the individual micromirrors 12 have a lead-out clock frequency of 10 kHz, for example, that is to say that the position of a respective micromirror 12 is acquired at 10 kHz and output as actuating element measurement data 15. The actuating element measurement data 15 have for example an information content of 32 bits in each case. This results in a data rate of the actuating element measurement data 15 of 192 MB/s or 24 MB/s for example.

On account of the technical boundary conditions, as described with reference to FIG. 1, for example, a data connection for transferring data out of the embedded system 11 or into the latter may however be restricted to 4 MB/s, for example. Furthermore, a clock frequency of the data transfer may be different than a clock frequency of the measuring elements 14, of the regulating unit 20 and/or of the first processing unit 32 of a state monitoring unit 30 (see e.g. FIG. 2). In order to be able to use the acquired actuating element measurement data 15 overall for state monitoring outside the embedded system 11, it is thus desirable to significantly reduce the data rate. This is achieved via preprocessing of the actuating element measurement data 15 via the first processing unit 32, which generates preprocessed state data 33 depending on the acquired actuating element measurement data 15. Since for example control data from an external controller (not illustrated) for regulating the micromirrors 12 and optionally further regulatable elements are to be transferred into the embedded system 11, the entire bandwidth is not available for transferring the preprocessed state data 33.

The first processing unit 32 is therefore configured to receive the actuating element measurement data 15 acquired with a data rate of 24 MB/s and to generate preprocessed state data 33 with a data rate of at most 2.4 MB/s. Since the state monitoring as described here is relatively noncritical, this can be carried out with lower priority temporally, such that for example time-critical control data, for example the actuating element driving data 42, can be preferentially transferred and/or calculated. For this purpose, the preprocessed state data 33 can be buffer-stored for a short period, for example, in order to be transferred at a point in time when a greater bandwidth is available for data transfer.

The second processing unit 34 receives the preprocessed state data 33 and determines a state of the EUV lithography apparatus 100, for example of the micromirrors 12 of the micromirror array M6, depending on the data. By virtue of the acquired actuating element measurement data 15 being used as a basis for the state monitoring, additional surroundings sensors 16 (see e.g. FIG. 2) can be obviated. Alternatively, the state of the EUV lithography apparatus 100, in conjunction with surroundings sensors 16, can be monitored significantly more accurately in this way.

In this exemplary embodiment, the micromirror array M6 with the micromirrors 12 and assigned measuring elements 14, the regulating unit 20, the first processing unit 32, the second processing unit 34 and the driving unit 40 form a control system 10.

Figure 4:
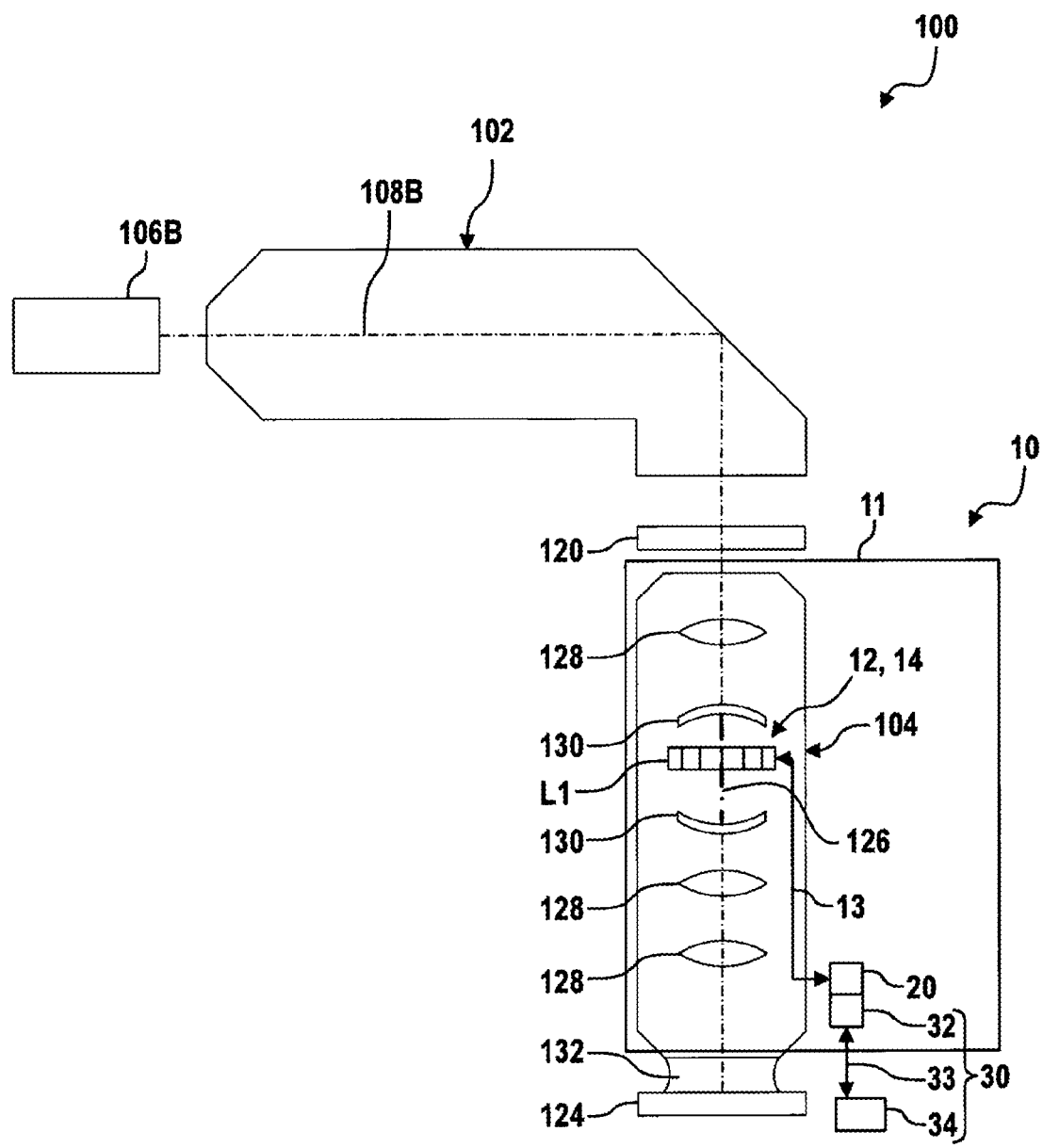
FIG. 4 shows a schematic view of a second embodiment of an optical system embodied as a DUV lithography apparatus.

FIG. 4 shows a schematic view of a second embodiment of an optical system 100, embodied as a DUV lithography apparatus.

The DUV lithography apparatus 100 includes a beam shaping and illumination system 102 and a projection system 104. In this case, DUV stands for "deep ultraviolet" and denotes a wavelength of the working light of between 30 and 250 nm. As has already been described with reference to FIG. 3, the beam shaping and illumination system 102 and the projection system 104 can be arranged in a vacuum housing and/or be surrounded by a machine room with corresponding drive devices.

The DUV lithography apparatus 100B has a DUV light source 106B. By way of example, an ArF excimer laser that emits radiation 108B in the DUV range at 193 nm, for example, can be provided as the DUV light source 106B.

The beam shaping and illumination system 102 illustrated in FIG. 4 guides the DUV radiation 108B onto a photomask 120. The photomask 120 is embodied as a transmissive optical element and can be arranged outside the systems 102, 104. The photomask 120 has a structure which is imaged onto a wafer 124 or the like in a reduced fashion via the projection system 104.

The projection system 104 has a plurality of lens elements 128 and/or mirrors 130 for imaging the photomask 120 onto the wafer 124. In this case, individual lens elements 128 and/or mirrors 130 of the projection system 104 can be arranged symmetrically in relation to an optical axis 126 of the projection system 104. It should be noted that the number of lens elements 128 and mirrors 130 of the DUV lithography apparatus 100 is not restricted to the number represented. A greater or lesser number of lens elements 128 and/or mirrors 130 can also be provided. Furthermore, the mirrors 130 are generally curved at their front side for beam shaping.

An air gap between the last lens element 128 and the wafer 124 can be replaced by a liquid medium 132 having a refractive index of >1. The liquid medium 132 may be for example high-purity water. Such a set-up is also referred to as immersion lithography and has an increased photolithographic resolution. The medium 132 can also be referred to as an immersion liquid.

The projection system 104 is arranged together with a regulating unit 20 and a first processing unit 32 in a vacuum housing and together with them forms an embedded system 11. The projection system 104 includes for example a microlens element array L1 including a plurality of actuatable microlens elements 12, and together with the drive logic 20, 32, 34 forms a control system 10. A position of each microlens element 12 of the microlens element array L1 is acquired by an assigned measuring element 14 and output to the regulating unit 20 in the form of actuating element measurement data 15, the regulating unit generating and outputting a regulating signal 13 for regulating the microlens elements 12 depending on the actuating element measurement data.

In the present case, the first processing unit 32 is arranged together with the regulating unit 20 on a board; for example, provision can be made for the regulating unit 20 and the first processing unit 32 to share specific resources. The first processing unit 32 generates preprocessed measurement data 33 depending on the acquired actuating element measurement data 15 and the regulating signal 13, the preprocessed measurement data being transferred to a second processing unit 34 situated outside the vacuum housing. By virtue of the fact that the first processing unit 32 takes account of the regulating signal 13, it is possible for example for wear phenomena to be acquired and a data rate of the preprocessed state data to be kept low. By way of example, a dependence of a position of a microlens element 12 on a current with which the actuator of the microlens element 12 is driven can be continuously determined or monitored by the first processing unit 32. If the determined dependence corresponds to a specific predefined dependence, there are no problems with the actuator. Provision can be made for no preprocessed state data 33 to be generated in this case. If a deviation from the predefined dependence and/or a change in the dependence over time are/is determined, provision can be made for generating and outputting corresponding preprocessed state data. Such a procedure thus implicitly involves determining the fact that a state of the optical systems 100 or of the control system 10 is good or is okay if no preprocessed state data 33 are generated and output.

Figure 5:
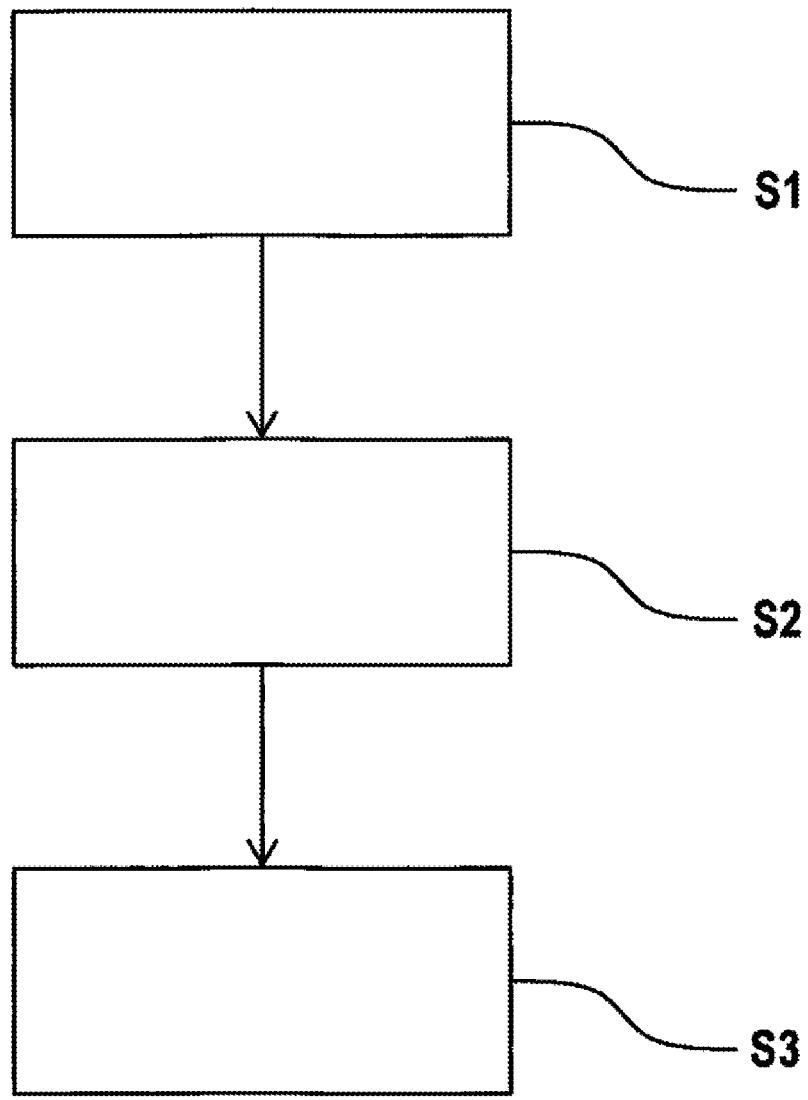
FIG. 5 shows a schematic block diagram of an exemplary embodiment of a method for operating a control system.

FIG. 5 shows a schematic block diagram of a method for operating a control system 10, for example from FIG. 1 or 2, or else of an optical system 100 as illustrated in FIG. 3 or 4.

In a first method step S1, actuating element measurement data 15 are acquired by the measuring elements 14 assigned to the actuating elements 12. The actuating element measurement data 15 include for example position sensor data that characterize a position of the respective actuating element 12. The acquired actuating element measurement data 15 are output or transferred for example a regulating unit 20 and a state monitoring unit 30.

In a second method step S2, the regulating unit 20 generates a regulating signal 13 for regulating the actuating elements 12 depending on the actuating element measurement data 15. This ensures for example that the respective actuating elements 12 are situated in a desired target position. Depending on the accuracy and speed of the regulation, external environmental influences such as, for example, oscillations, vibrations and/or air turbulence can thus be compensated for as well. In the case of optical systems, this is also referred to as adaptive optics.

In a third method step S3, the state monitoring unit 30 monitors a state of the control system 10 depending on the acquired actuating element measurement data 15. For example, the state monitoring unit 30 determines the total distance covered by an actuating element 12 in the course of an operating duration of the control system 10. Such information can be used for example to estimate a remaining life expectancy of the actuating element 12, and therefore to better plan maintenance of the control system 10.

Besides the method steps illustrated, the method can include many further steps evident for example from the description of the control system 10 in FIG. 1 or 2 and from the description of the optical system in FIG. 3 or 4. In this respect, the aspects described there should be regarded as substeps of the method steps described here and/or additional steps of the method.

Figure 6:
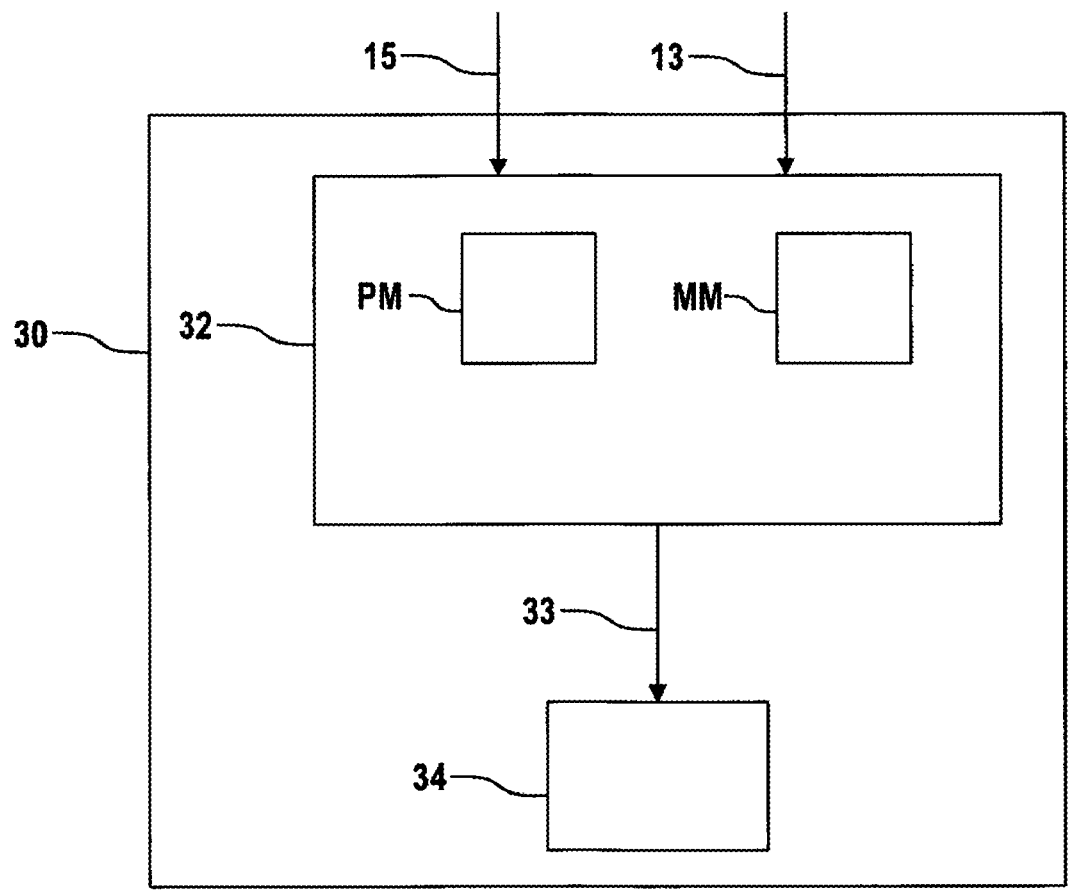
FIG. 6 shows a schematic block diagram of an embodiment of a state monitoring unit.

FIG. 6 shows a schematic block diagram of an embodiment of a state monitoring unit 30. The state monitoring unit 30 can be used for example in the control system 10 in FIG. 1 or 2 or as part of the control system 10 of the optical systems 100 in FIG. 3 or 4. The state monitoring unit 30 illustrated includes a first processing unit 32 and a second processing unit 34. Optionally, the first processing unit 32 is arranged in the embedded system 11 (see FIG. 2, 3 or 4), and the second processing unit 34 is arranged outside the embedded system 11. As described with reference to FIGS. 1-4, the state processing unit 30 receives actuating element measurement data 15 from at least one measuring element 14 (see FIGS. 1-4) assigned to an actuating element 12 (see FIGS. 1-4) of the control system 10. Optionally, in addition to that the state processing unit 30 can receive the regulating signal 13 generated by a regulating unit 20 (see FIGS. 1-4).

In this example, the first processing unit 32 is configured for example to generate preprocessed state data 33 depending on the acquired actuating element measurement data 15 and a physical model PM and/or mathematical model MM of the respective actuating element 12. Optionally, the regulating signal 13 can additionally be taken into account when generating the preprocessed state data 33. A physical model PM includes for example a mechanical description of physical relationships and/or physical parameters. One example of such a physical model PM for an actuating element embodied as a magnetic actuator, for example, is a relation between a coil current and a magnetic field generated thereby and also a change in the position of the actuator caused by the magnetic field generated, thermal effects also being taken into account, for example. One example of a mathematical model MM is the formation of an average value, which can involve for example a weighted average and/or a moving average. For different actuating elements 12, different physical models PM and/or mathematical models MM can be applied depending on the type of respective actuating element 12.

Such physical models PM and/or mathematical models MM can allow one or more characteristic values for a respective system to be determined or derived from a large amount of data, which values can have for example a physical dimension or significance. Furthermore, the physical model PM and/or the mathematical model MM can include statistical methods, such that proceeding from value distributions, for example, moments of these distributions can be determined, for example a standard deviation, a variance and suchlike.

Although the present disclosure has been described on the basis of exemplary embodiments, it is modifiable in diverse ways. For example, the described concept of state monitoring can be applied to a multiplicity of control systems. The data acquired by the measuring elements can be used directly, for example completely, for state monitoring, whereas these data are used only for regulation in conventional control systems. These conventional systems therefore involve surroundings sensors for state monitoring. The state of the control system according to the disclosure can thus be monitored significantly more precisely and also without the use of surroundings sensors.

LIST OF REFERENCE SIGNS

10 Control system
11 Embedded system
12 Actuating element
13 Regulating signal
14 Measuring element
15 Actuating element measurement data
16 Surroundings sensor
17 Surroundings sensor data
20 Regulating unit
30 State monitoring unit
32 First processing unit
33 Preprocessed state data
34 Second processing unit
40 Driving unit
42 Actuating element driving data
100 Optical system
102 Beam shaping and illumination system
104 Projection system
106A EUV light source
106B DUV light source
108A EUV radiation
108B DUV radiation
110 Mirror
112 Mirror
114 Mirror
116 Mirror
118 Mirror
120 Photomask
122 Mirror
124 Wafer
126 Optical axis
128 Lens element
130 Mirror
132 Medium
L1 Microlens element array
M1 Mirror
M2 Mirror
M3 Mirror
M4 Mirror
M5 Mirror
M6 Micromirror array
MM Mathematical model
PM Physical model
S1 Method step
S2 Method step
S3 Method step

What is claimed is:

1. A control system, comprising:
an actuating element;
a measuring element configured to acquire actuating element measurement data of the actuating element;
a regulating unit configured to generate a regulating signal to regulate the actuating element depending on the acquired actuating element measurement data; and
a state monitoring unit configured to monitor a state of the control system depending on the acquired actuating element measurement data, the state monitoring unit comprising:
a first processing unit configured to generate preprocessed state data depending on (i) the acquired actuating element measurement data and at least one member selected from the group consisting of a physical model of the actuating element and a mathematical model of the actuating element, or (ii) at least one member selected from the group consisting of the acquired actuating element measurement data, a physical model of the actuating element and the generated regulating signal, and a mathematical model of the actuating element and the generated regulating signal; and
a second processing unit configured to determine the state of the control system depending on the preprocessed state data.

2. The control system of claim 1, wherein the first processing unit is configured to acquire and process the acquired actuating element measurement data continuously.

3. The control system of claim 1, wherein the first processing unit is configured to generate the preprocessed state data depending on the acquired actuating element measurement data during ongoing operation of the control system.

4. The control system of claim 1, further comprising a driving unit configured to generate actuating element driving data depending on an implemented operating program, wherein:
the regulating unit is configured to generate the regulating signal depending on the actuating element driving data; and
the first processing unit is configured to generate the pre-processed state data depending on the currently implemented operating program.

5. The control system control system of claim 1, further comprising a surroundings sensor configured to acquire surroundings sensor data, wherein the first processing unit is configured to generate the pre-processed state data depending on the acquired surroundings sensor data.

6. The control system of claim 1, wherein the measuring element is configured to acquire the actuating element measurement data with a frequency of 1 kHz to MHz.

7. The control system of claim 1, wherein the regulating unit is configured to generate the regulating signal with a frequency of 1 kHz to MHz.

8. The control system of claim 1, wherein:
the first processing unit is configured to generate the preprocessed state data with a data rate that is at most 10% of a data rate of the acquired actuating element measurement data; and
the control system is configured so that each individual acquired actuating element measurement datum influences the preprocessed state data.

9. The control system of claim 1, wherein:
the actuating element comprises an actuator configured to set a position of an element; and
the measuring element comprises a position sensor configured to acquire the position of the element.

10. The control system of claim 1, wherein the state monitoring unit is configured to determine a future state of the control system depending on the monitored state or the preprocessed state data.

11. The control system of claim 1, wherein the first processing unit is configured to generate preprocessed state data depending on the acquired actuating element measurement data and a physical model of the actuating element.

12. The control system of claim 1, wherein the first processing unit is configured to generate preprocessed state data depending on the acquired actuating element measurement data and at least one member selected from the group consisting of a physical model of the actuating element and a mathematical model of the actuating element.

13. The control system of claim 1, wherein the first processing unit is configured to generate preprocessed state data depending on the acquired actuating element measurement data, a physical model of the actuating element and a mathematical model of the actuating element.

14. The control system of claim 1, wherein the first processing unit is configured to generate preprocessed state data depending on at least one member selected from the group consisting of the acquired actuating element measurement data, a physical model of the actuating element and the generated regulating signal, and a mathematical model of the actuating element and the generated regulating signal.

15. The control system of claim 1, wherein the first processing unit is configured to generate preprocessed state data depending on at least two members selected from the group consisting of the acquired actuating element measurement data, a physical model of the actuating element and the generated regulating signal, and a mathematical model of the actuating element and the generated regulating signal.

16. The control system of claim 1, wherein the first processing unit is configured to generate preprocessed state data depending on the acquired actuating element measurement data, a physical model of the actuating element and the generated regulating signal, and a mathematical model of the actuating element and the generated regulating signal.

17. A system, comprising:
a control system according to claim 1,
wherein the system is an optical system.

18. An apparatus, comprising:
an illumination system configured to illuminate a reticle;
a projection system configured to project the illuminated reticle onto a light-sensitive material; and
a control system according to claim 1.

19. The apparatus of claim 18, wherein the apparatus is an EUV lithography apparatus.

20. A method, comprising:
acquiring actuating element measurement data of an actuating element of a control system;
generating a regulating signal depending on the acquired actuating element measurement data;
monitoring a state of the control system or of an optical system comprising the control system depending on the actuating element measurement data;
generating pre-processed state data depending on (i) the acquired actuating element measurement data and at least one model selected from the group consisting of a physical model of the actuating element and a mathematical model of the actuating element, or (ii) at least one member selected from the group consisting of the acquired actuating element measurement data, a physical model of the actuating element and the generated regulating signal, and a mathematical model of the actuating element and the generated regulating signal; and
to determining the state of the control system or of the optical system depending on the preprocessed state data.

* * * * *

UNITED STATES PATENT AND TRADEMARK OFFICE
CERTIFICATE OF CORRECTION

PATENT NO. : 11,630,395 B2
APPLICATION NO. : 17/395837
DATED : April 18, 2023
INVENTOR(S) : Malte Hoffmann and Gunther Schulz It is certified that error appears in the above-identified patent and that said Letters Patent is hereby corrected as shown below:

On the Title Page

Column 2, Item (57) Abstract, Line 6, delete "meas-urement" insert -- measurement --.

In the Specification

Column 2, Line 27, delete "fac-tory," insert -- factory, --.

Column 7, Line 52, delete "desiable" insert -- desirable --.

Column 9, Line 56, delete "ex-citations," insert -- excitations, --.

Column 12, Line 66, delete "illustrated" insert -- illustrated) --.

Column 13, Line 43, delete "in-crease" insert -- increase --.

Column 14, Line 8, delete "thereof" insert -- thereof. --.

Column 14, Lines 8-23, delete "In this example, the embedded system 11 furthermore includes a first processing unit 32." insert the same before "The first processing" at Column 14, Line 11.

In the Claims

Column 20, Line 60, Claim 5, delete "control system control system" insert -- control system --.

Signed and Sealed this
Sixth Day of June, 2023

Katherine Kelly Vidal
*Director of the United States Patent and Trademark Office*